(12) United States Patent
Choi et al.

(10) Patent No.: US 8,847,378 B2
(45) Date of Patent: Sep. 30, 2014

(54) SEMICONDUCTOR PACKAGE

(71) Applicant: Samsung Electronics Co., Ltd, Suwon-si (KR)

(72) Inventors: Yun-Seok Choi, Hwaseong-si (KR); Tae-je Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/738,322

(22) Filed: Jan. 10, 2013

(65) Prior Publication Data

US 2013/0175702 A1    Jul. 11, 2013

(30) Foreign Application Priority Data

Jan. 11, 2012   (KR) .................. 10-2012-0003453

(51) Int. Cl.

| | | |
|---|---|---|
| *H01L 23/02* | (2006.01) | |
| *H01L 23/48* | (2006.01) | |
| *H01L 25/10* | (2006.01) | |
| H01L 25/065 | (2006.01) | |
| H01L 21/56 | (2006.01) | |
| H01L 23/31 | (2006.01) | |

(52) U.S. Cl.
CPC ....... *H01L 23/481* (2013.01); *H01L 2225/1023* (2013.01); *H01L 2225/0651* (2013.01); *H01L 2924/10253* (2013.01); *H01L 2224/73204* (2013.01); *H01L 25/0652* (2013.01); *H01L 2225/06541* (2013.01); *H01L 2224/48091* (2013.01); *H01L 2224/48227* (2013.01); *H01L 21/561* (2013.01); *H01L 2224/0557* (2013.01); *H01L 2224/0401* (2013.01); *H01L 2225/06517* (2013.01); *H01L 2224/73265* (2013.01); *H01L 2924/1815* (2013.01); *H01L 2924/18161* (2013.01); *H01L 2224/06181* (2013.01); *H01L 2224/45139* (2013.01); *H01L 2224/32225* (2013.01); *H01L 25/105* (2013.01); *H01L 2225/06513* (2013.01); *H01L 2225/06568* (2013.01); *H01L 2224/92125* (2013.01); *H01L 2924/15331* (2013.01); *H01L 25/0657* (2013.01); *H01L 2224/32145* (2013.01); *H01L 2224/16145* (2013.01); *H01L 2924/15311* (2013.01); *H01L 2225/1058* (2013.01); *H01L 2224/16225* (2013.01); *H01L 23/3128* (2013.01)
USPC ............ 257/686; 257/E25.006; 257/E25.021; 257/E25.027; 257/E23.085

(58) Field of Classification Search
USPC ................. 257/686, 777, E25.006, E25.013, 257/E25.027, E23.085, 790, 698, E25.021; 438/109, FOR. 368, FOR. 426
See application file for complete search history.

(56) References Cited

U.S. PATENT DOCUMENTS

| | | |
|---|---|---|
| 7,265,442 B2 | 9/2007 | Henttonen |
| 7,964,952 B2 | 6/2011 | Lee |
| 8,022,528 B2 | 9/2011 | Kim |
| 8,026,584 B2 | 9/2011 | Kim |
| 2006/0208358 A1 | 9/2006 | Henttonen |
| 2009/0102037 A1 | 4/2009 | Kim |
| 2009/0179319 A1 | 7/2009 | Lee |
| 2011/0024888 A1 | 2/2011 | Pagaila et al. |
| 2011/0063805 A1 | 3/2011 | Kim |
| 2011/0089552 A1* | 4/2011 | Park et al. ..................... 257/686 |
| 2011/0115081 A1 | 5/2011 | Osumi |
| 2011/0117700 A1 | 5/2011 | Weng et al. |
| 2011/0156250 A1 | 6/2011 | Goh et al. |
| 2012/0225523 A1* | 9/2012 | Wachtler et al. .............. 438/107 |

FOREIGN PATENT DOCUMENTS

| | | |
|---|---|---|
| KR | 1020080020069 | 3/2008 |
| KR | 100839075 | 6/2008 |
| KR | 1020110076604 | 7/2011 |

\* cited by examiner

*Primary Examiner* — Jasmine Clark
(74) *Attorney, Agent, or Firm* — Stanzione & Kim, LLP

(57) ABSTRACT

A semiconductor package includes a first semiconductor package, a second semiconductor package, and a package-connecting member. The first semiconductor package includes a first substrate, a chip stacking portion disposed on the first substrate and including a plurality of first semiconductor chips, and a first sealant for surrounding the chip stacking portion on the first substrate. The second semiconductor package includes a second substrate, at least one second semiconductor chip disposed on the second substrate, and a second sealant for surrounding the second semiconductor chip on the second substrate. The package-connecting member electrically connects the first semiconductor package and the second semiconductor package. The plurality of first semiconductor chips include a first chip including through silicon vias (TSVs) and a second chip electrically connected to the first chip via the TSVs, and the chip stacking portion includes an internal sealant for filling a space between the first chip and the second chip and extending to a side of the second chip.

20 Claims, 11 Drawing Sheets

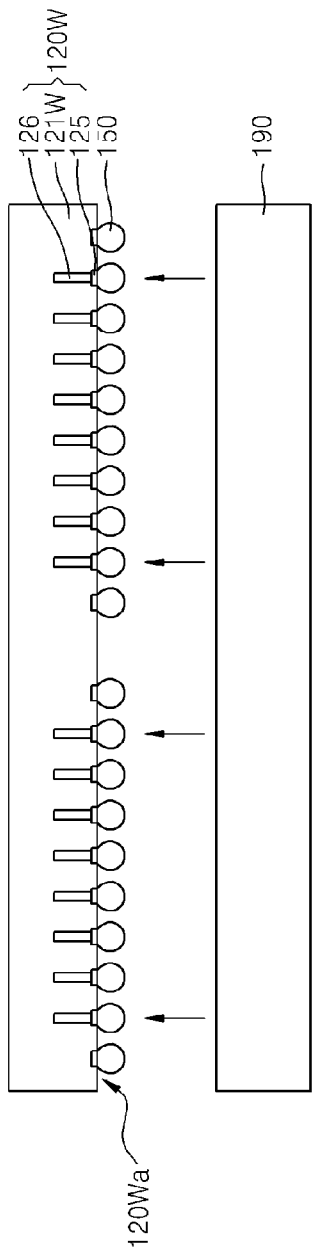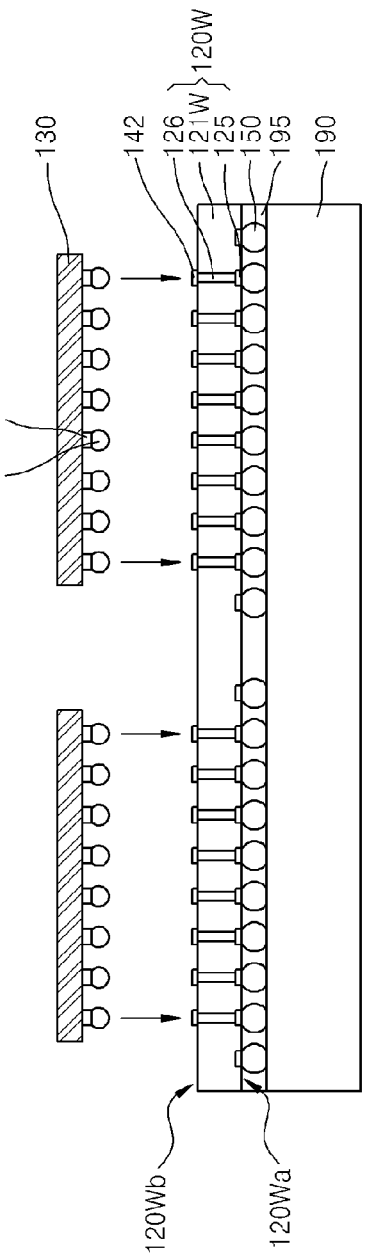

SEMICONDUCTOR PACKAGE

CROSS-REFERENCE TO RELATED APPLICATIONS

This application claims priority under 35 U.S.C. §119 from Korean Patent Application No. 10-2012-0003453, filed on Jan. 11, 2012, in the Korean Intellectual Property Office, the disclosure of which is incorporated herein in its entirety by reference.

BACKGROUND

1. Field

The inventive concept relates to a semiconductor package, and more particularly, to a package on package (POP) type of semiconductor package on which one package is stacked on another package.

2. Description of the Related Art

A package on package (POP) refers to a semiconductor package on which an upper semiconductor package and a lower semiconductor package are stacked with respect to each other in a vertical direction in order to implement a highly-integrated semiconductor device. In the related art, a degree of integration of the semiconductor device has been enhanced by a wafer manufacturing process. However, it is still needed to enhance the degree of integration of the semiconductor device and to diversify a function of the semiconductor device by using various package manufacturing technologies.

SUMMARY

The inventive concept provides a semiconductor package efficiently formed using a manufacturing process and having a light weight.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a semiconductor package including a first semiconductor package including a first substrate, a chip stacking portion disposed on the first substrate and including a plurality of first semiconductor chips, and a first sealant for surrounding the chip stacking portion on the first substrate; a second semiconductor package including a second substrate, at least one second semiconductor chip disposed on the second substrate, and a second sealant for surrounding the second semiconductor chip on the second substrate, and a package-connecting member for electrically connecting the first semiconductor package and the second semiconductor package, wherein the plurality of first semiconductor chips include a first chip including through silicon vias (TSVs), and a second chip electrically connected to the first chip via the TSVs, and the chip stacking portion includes an internal sealant for filling a space between the first chip and the second chip and extending to sides of the second chip.

The second chip, the first sealant, and the internal sealant may be exposed through a top surface of the first semiconductor package.

The internal sealant may include an underfill portion for filling a space between the plurality of first semiconductor chips, and a cover portion disposed outside the underfill portion, and the internal sealant may not cover a top surface of the first semiconductor chip disposed at the uppermost portion of the chip stacking portion.

The semiconductor package may include a package on package (POP) type on which the second semiconductor package is stacked on the first semiconductor package.

A top surface of the first sealant may be spaced apart from a bottom surface of the second substrate by a predetermined distance.

The chip stacking portion as a flip-chip type may be mounted on the first substrate, and the chip stacking portion and the first substrate may be electrically connected to each other by bumps.

The package-connecting member may be disposed at at least one side of the chip stacking portion and may connect the first substrate and the second substrate.

The semiconductor package may further include connection members disposed between the first chip and the second chip and electrically connected to the TSVs.

The second semiconductor package may include a plurality of second semiconductor chips, and the at least one second semiconductor chip may include TSVs.

Two or more second chips may be spaced apart from each other on the first chip by a predetermined distance.

At least one first semiconductor chip including TSVs may be disposed between the first chip and the second chip.

The first chip may have an area smaller than an area of the second chip.

The first chip may include a length of at least one cross-section that is less than a length of one cross-section of the second chip.

The first sealant and the second chip may be exposed through the top surface of the first semiconductor package.

The foregoing and/or other features and utilities of the present general inventive concept may also be achieved by providing a semiconductor package including a first semiconductor package, and a second semiconductor package disposed on the first semiconductor package and electrically connected to the first semiconductor package, wherein at least one of the first semiconductor package and the second semiconductor package includes a chip stacking portion, and the chip stacking portion includes a hexahedral structure including a plurality of semiconductor chips electrically connected each other via through silicon vias (TSVs) and an internal sealant for surrounding the plurality of semiconductor chips.

The foregoing and/or other features and utilities of the present general inventive concept may also be achieved by providing an electronic apparatus including the above-described semiconductor package and a controller to control the semiconductor package to read data therefrom or store data therein to perform a function of the electronic apparatus.

The foregoing and/or other features and utilities of the present general inventive concept may also be achieved by providing a semiconductor package including a first semiconductor package having a first substrate and one or more first semiconductor chips disposed on a first portion of the first substrate and electrically connected to each other using one or more through silicon vias, a second semiconductor package having a second substrate and one or more second semiconductor chips disposed on the second substrate, and one or more package-connecting balls disposed on a second portion of the first substrate, to electrically connect the first semiconductor package and the second semiconductor package, and to protrude from the first semiconductor by a height to maintain a distance between the first semiconductor package and the second semiconductor.

The through silicon vias may be formed in at least one of the first semiconductor chips to electrically connect the other one of the first semiconductor chips to the substrate.

The one or more first semiconductor chips of the first semiconductor package may include a first chip having the through silicon vias and disposed on the first substrate, and a second chip disposed on the second chip to be electrically connected to the substrate through the through silicon vias.

The first semiconductor package may include a chip stacking portion disposed on the first portion of the first substrate. The first semiconductor chips may include a first chip and a second chip. The chip stacking portion may include the first chip having the through silicon vias and disposed on the first portion of the first substrate, the second chip spaced apart from the first chip by a distance and electrically connected to the first substrate through the through silicon vias of the first chip, and an internal sealant formed between the first chip and the second chip.

The first semiconductor package may include a first sealant formed between the chip stacking portion and the first substrate and between the chip stacking portion and the one or more package-connecting balls

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIGS. 2A through 2H are cross-sectional views illustrating a method of manufacturing the semiconductor package of FIG. 1, according to an exemplary embodiment of the inventive concept;

DETAILED DESCRIPTION OF THE EMBODIMENTS

Figure 1:
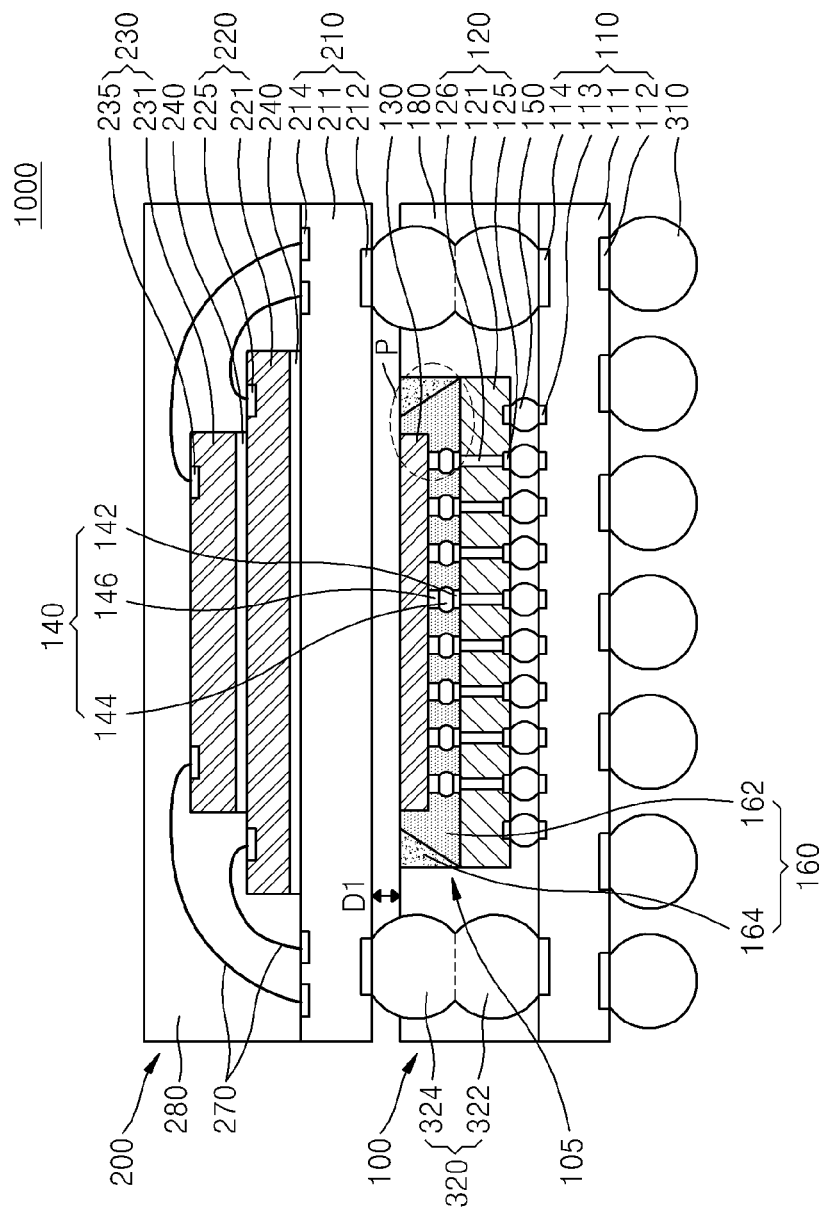
FIG. 1 is a cross-sectional view illustrating a semiconductor package according to an exemplary embodiment of the inventive concept.

As used herein, the term "and/or" includes any and all combinations of one or more of the associated listed items.

Expressions such as "at least one of," when preceding a list of elements, modify the entire list of elements and do not modify the individual elements of the list.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

The attached drawings for illustrating exemplary embodiments of the inventive concept are referred to in order to gain a sufficient understanding of the inventive concept, the merits thereof, and the objectives accomplished by the implementation of the inventive concept. The inventive concept may, however, be embodied in many different forms and should not be construed as being limited to the embodiments set forth herein; rather, these embodiments are provided so that this disclosure will be thorough and complete, and will fully convey the concept of the invention to those skilled in the art.

It will be understood that the terms may be used herein to describe particular embodiments should not be limited by these terms. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section.

In the drawings, for example, illustrated shapes may be deformed according to fabrication technology and/or tolerances. Therefore, the exemplary embodiments of the inventive concept are not limited to certain shapes illustrated in the present specification, and may include modifications of shapes caused in fabrication processes. Furthermore, various elements and regions in the drawings are schematically shown. Thus, the inventive concept is not limited to relative sizes or distances shown in the attached drawings.

FIG. 1 is a cross-sectional view illustrating a semiconductor package 1 according to an exemplary embodiment of the inventive concept.

Referring to FIG. 1, the semiconductor package 1000 according to the present embodiment includes a first semiconductor package 100 and a second semiconductor package 200. The semiconductor package 1000 may be of a package on package (POP) type in which a second semiconductor package 200 is stacked on a first semiconductor package 100.

The first semiconductor package 100 may include a first substrate 110, a chip stacking portion 105, and a first sealant 180.

The first substrate 110 may support the chip stacking portion 105 and may include a main body portion 111, a lower pad 112 disposed on a bottom surface of the first substrate 110, intermediate pads 113 disposed on a top surface of the first substrate 110, and upper pads 114 disposed on the top surface of the first substrate 110. The first substrate 110 may include silicon, glass, ceramic, or plastic, for example. The first substrate 110 may be formed based on an active wafer or interposer substrate. Here, the active wafer refers to a wafer on which a semiconductor chip may be formed, such as a silicon wafer. In addition, the first substrate 110 may have a single layer structure, or a multi-layer structure including wiring patterns formed therein.

The chip stacking portion 105 may include a first chip 120, a second chip 130, connection members 140, and an internal sealant 160.

The first chip 120 includes a body portion 121, chip pads 125 disposed inside the first chip 120, and through silicon vias (TSVs) 126 disposed inside the first chip 120. The chip pads 125 may be formed of a conductive material on a bottom surface of the body portion 121 and may penetrate a passivation layer (not illustrated) to be electrically connected to the TSVs 126. In addition, the chip pads 125 may be not connected directly to the TSV 126 but may be connected to the TSVs 126 via wiring layers (not shown) formed in the body portion 121. The number and shape of the chip pads 125 and the TSVs 126 are not limited thereto, and the chip pads 125 and the TSVs 126 may be variously modified.

It is possible that a first number of the chip pads 125, bumps 150, and the intermediate pads 113 can be used to connect the second chip 130 to an electrical circuit of the first substrate 110 through the TSVs 126, and a second number of the chip pads 125, bumps 150, and the intermediate pads 113 can be used to connect the first chip 120 to the electric circuit of the first substrate 110. The second number of the chip pads 125, bumps 150, and the intermediate pads 113 may not be connected to the TSVs. The second number of the chip pads 125, bumps 150, and the intermediate pads 113 may be disposed in an outside area of the first chip 120, and the first number of the chip pads 125, bumps 150, and the intermediate pads 113 are disposed in an inside area of the first chip 120. However, the present general inventive concept is not limited thereto. It is possible that the second number of the chip pads 125, bumps 150, and the intermediate pads 113 may be disposed in the inside area of the first chip 120, and the first number of the chip pads 125, bumps 150, and the intermediate pads 113 are disposed in the outside area of the first chip 120. It is also possible that locations of the second number of the chip pads 125, bumps 150, and the intermediate pads 113 and the locations of the first number of the chip pads 125, bumps 150, and the intermediate pads 113 can be determined according to a length of the second chip 130 with respect to a length of the first chip 120 or according to an overlap area of the first chip 120 and the second chip 130 with respect to the first substrate 110.

The TSVs 126 may include at least one metal. For example, the TSVs 126 may include a barrier metal layer (not illustrated) and a wiring metal layer (not illustrated). The barrier metal layer may include at least one selected from the group consisting of titanium (Ti), tantalum (Ta), titanium nitride (TiN), and tantalum nitride (TaN). The wiring metal layer (not illustrated) may include at least one selected from the group consisting of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr).

The second chip 130 may be electrically connected to the first chip 120 via connection members 140. The connection members 140 each may include pad portions 142, bonding portions 144, and pillar portions 146. The connection members 140 may include a conductive material, for example, at least one selected from the group consisting of Cu, Al, silver (Ag), tin (Sn), Au, and solder.

An active layer may be formed on respective bottom surfaces of the first chip 120 and the second chip 130. Thus, the first semiconductor package 100 may be of a flip-chip type. The first chip 120 and the second chip 130 each may include a plurality of semiconductor chips. The plurality of semiconductor chips may be of the same or different types. For example, the first chip 120 and the second chip 130 each may include a configuration in which one or more logic semiconductor chips and one or more memory semiconductor chips are combined with each other.

For example, the first chip 120 may be a logic semiconductor chip, and the second chip 130 may be a memory semiconductor chip. The logic semiconductor chip may be a microprocessor, for example, a central processing unit (CPU), a controller, an application specific integrated circuit (ASIC), or the like. In addition, the memory semiconductor chip may be a volatile memory, such as a dynamic random access memory (DRAM) or a static random access memory (SRAM), a flash memory, or the like. Thus, the chip stacking portion 105 may correspond to a system in package (SIP).

The internal sealant 160 may include an underfill portion 162 for filling a space between the first chip 120 and the second chip 130, and a cover portion 164 disposed outside the underfill portion 162. The internal sealant 160 may be formed of an underfill resin, such as an epoxy resin, silica filler, or flux. The underfill portion 162 and the cover portion 164 may include different materials. The arrangement of the underfill portion 162 and the cover portion 164 in the internal sealant 160 will now be described in association with a region P of FIG. 1 with reference to FIGS. 3A through 3C in detail.

According to the present embodiment, the chip stacking portion 105 is a hexahedral due to the internal sealant 160. When the semiconductor package 1000 is manufactured, the chip stacking portion 105 may be handled as one structure or device. This will be described with reference to FIGS. 2A through 2H.

Bumps 150 may be disposed on the bottom surface of the chip stacking portion 105 to correspond to the intermediate pads 113 in order to electrically connect the chip stacking portion 105 and the first substrate 110. The bumps 150 may include at least one selected from the group consisting of Au, Ag, Pt, Al, Cu, and solder. The bumps 150 may be formed by a sputtering process, a plating process using pulse plating or direct current (DC) plating, a soldering process, or an attachment process. However, the material and the formation method of the bumps 150 are not limited thereto, and various signal transfer mediums, such as wires, solder balls, or the like, may be used.

The first sealant 180 may surround the chip stacking portion 105 on the first substrate 110 to protect the chip stacking portion 105. The first sealant 180 may be formed of a silicon-based material, a thermosetting material, a thermoplastic, a ultraviolet (UV) processing material, or the like. The first sealant 180 may include material that is different from material used in forming the internal sealant 160; however, aspects of the inventive concept are not limited thereto. The first sealant 180 may be spaced apart from the second semiconductor package 200 by a predetermined distance D1 so that a top surface of the chip stacking portion 105 may be exposed. The second chip 130, the internal sealant 160, and the first sealant 180 may be exposed to a top surface of the first semiconductor package 100. The first sealant 180 may be formed to expose the top surface of the chip stacking portion 105 so that the overall height of the first semiconductor package 100 may be reduced. As a result, the overall height of the semiconductor package 1000 may be reduced.

The second semiconductor package 200 may include a second substrate 210, a lower semiconductor chip 220, an upper semiconductor chip 230, and a second sealant 280.

The second substrate 210 may support the lower semiconductor chip 220 and the upper semiconductor chip 230 and may include a body portion 211, lower pads 212 disposed on a bottom surface of the second substrate 210, and upper pads 214 disposed on a top surface of the second substrate 210. The second substrate 210 may be formed of material that is the same as or similar to the material used in forming the first substrate 110.

The lower semiconductor chip 220 and the upper semiconductor chip 230 include body portions 221 and 231, respectively. The lower semiconductor chip 220 may be installed on the second substrate 210 by means of an adhesive layer 240 (240*a*), and the upper semiconductor chip 230 may also be installed on the second substrate 210 by means of an adhesive layer 240 (240*b*). The lower semiconductor chip 220 and the upper semiconductor chip 230 may be memory semiconductor chips, for example. The lower semiconductor chip 220 and the upper semiconductor chip 230 may include chip pads 225 and 235, respectively, and the chip pads 225 and 235 may be electrically connected to the upper pads 214 of the second substrate 210 via wires 270.

The wires 270 may be a type of signal transfer medium for electrically connecting the chip pads 225 and 235 and the upper pads 214, and various signal transfer mediums, such as bumps or solder balls, as well as the wires 270 may be used. The wires 270 may be wires for semiconductor bonding, may include at least one selected from the group consisting of Au, Ag, Pt, Al, Cu, palladium (Pd), nickel (Ni), Co, chromium (Cr), and Ti and may be formed by a wire bonding apparatus.

The second sealant 280 surrounds the lower semiconductor chip 220 and the upper semiconductor chip 230, and the wires 270 to protect them. The second sealant 280 may be formed of a silicon-based material, a thermosetting material, a thermoplastic material, a UV processing material, or the like. In addition, the second sealant 280 may be formed of polymer, such as resin, and for example, the second sealant 280 may be formed of epoxy molding compound (EMC).

The first semiconductor package 100 and the second semiconductor package 200 may be electrically connected to each other by using package-connecting solder balls 320. The package-connecting solder balls 320 are interposed between the upper pads 114 of the first substrate 110 and the lower pads 212 of the second substrate 210 so that the upper pads 114 of the first substrate 110 and the lower pads 212 of the second substrate 210 may be electrically connected to each other. In addition, the package-connecting solder balls 320 may include lower balls 322 and upper balls 324 and may structurally securely fix the first semiconductor package 100 and the second semiconductor package 200.

Material used in forming the package-connecting solder balls 320 is not limited to solder. For example, the package-connecting solder balls 320 may include at least one selected from the group consisting of Sn, Ag, Cu, and Al as well as solder. In addition, the shape of the package-connecting solder balls 320 is not limited to the ball shape illustrated in FIG. 1. For example, the package-connecting solder balls 320 may be modified in various shapes, such as a cylindrical shape, a polygonal pillar shape, a polyhedral shape, or the like.

Bonding solder balls 310 may be attached to the bottom surface of the first substrate 110. The bonding solder balls 310 may be formed of the same material as the material for the package-connecting solder balls 320. The first semiconductor package 100 and the second semiconductor package 200 may be electrically connected to an external device, such as a system substrate or a main board, by means of the bonding solder balls 310.

In the present embodiment, the semiconductor package 1000 include a plurality of semiconductor chips, such as the first chip 120, the second chip 130, the lower semiconductor chip 220, and the upper semiconductor chip 230. The plurality of semiconductor chips may have a plurality of functions. In addition, the semiconductor package 1000 constitutes the chip stacking portion 105 of the SIP type including the TSVs 126 as a portion of POP and thus implementing a high-speed and high-intensity semiconductor package.

FIGS. 2A through 2H are cross-sectional views illustrating a method of manufacturing the semiconductor package 100 of FIG. 1 according to an exemplary embodiment of the inventive concept.

Referring to FIG. 2A, a process of manufacturing the chip stacking portion 105 (see FIG. 1) is performed. A base wafer 120W in which a plurality of TSVs 126 is formed, is prepared. The base wafer 120W further includes a body portion 121W and chip pads 125, and the first chip 120 of FIG. 1 is formed by subsequent processes. The bumps 150 corresponding to the chip pads 125 are disposed on a first surface 120Wa of the base wafer 120W. However, the bumps 150 may also be formed by the following processes. One or more of the chip pads 125 and one or more of the bumps 150 may not be connected to the TSVs 126 as illustrated in FIG. 2A. In this case, the chip pads 125 and the bumps 150 may not be connected to wiring layers (not illustrated) formed in the base wafer 120W. The TSVs 126 may be exposed to the first surface 120Wa of the base wafer 120W. The chip pads 125 disposed on the corresponding TSVs 126 may be exposed from the first surface 120Wa of the base wafer 120W.

A carrier substrate 190 may be attached onto the first surface 120Wa of the base wafer 120W by using an adhesive layer 195 (see FIG. 2B). The adhesive layer 195 may be formed of material that enables the carrier substrate 190 to be detached from the first surface 120Wa in a subsequent process, such as a film or liquid type material.

The carrier substrate 190 uses thinning of the base wafer 120W in the subsequent process. If thinning is completed, a thickness of the base wafer 120W is reduced by less than several tens of μm. Thus, a support portion, such as a wafer supporting system (VVSS), is to be provided in order to process the base wafer 120W to have a reduced thickness as a thin base wafer. The carrier substrate 190 may include silicon, germanium, silicon-germanium, gallium-arsenic (GaAs), glass, plastic, ceramic, or the like.

Referring to FIG. 2B, thinning of the base wafer 120W may be performed so that the TSVs 126 may also be exposed to a second surface 120Wb of the base wafer 120W. After the base wafer 120W is thinned, the pad portions 142 may be formed on the TSVs 126 exposed to the second surface 120Wb.

A process of connecting the second chip 130 on which the pillar portions 146 and the bonding portions 144 are formed, to the base wafer 120W may be performed. Connection between the base wafer 120W and the second chip 130 may be performed by physically connecting the pads 142 and the corresponding bonding portions 144.

Figure 2C:
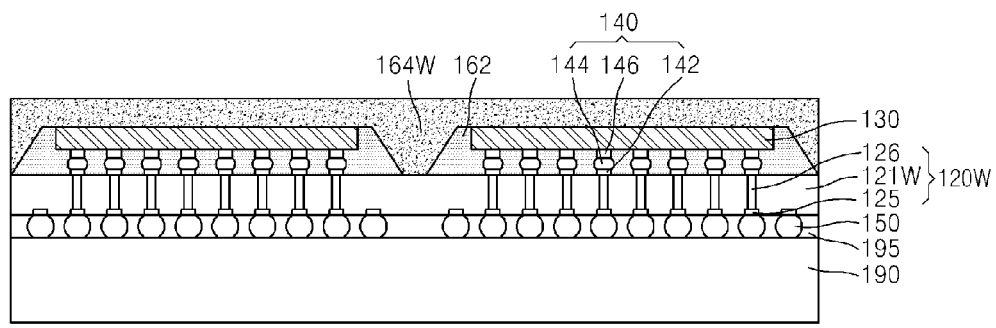

Referring to FIG. 2C, the underfill portion 162 is formed on the base wafer 120W having the second chips 130 attached thereto and fills a space between the connection members 140 and a space between the second chip 130 and the base wafer 120W. The height and shape of the underfill portion 162 are not limited thereto. For example, the underfill portion 162 may also be formed to be lower than the top surface of the second chip 130.

A wafer cover portion 164W is formed on the underfill portion 162 and the second chip 130. The wafer cover portion 164W may be formed of an underfill resin, such as an epoxy resin, or may include silica filler or flux. The wafer cover portion 164W may include material that is different from the material used in forming the underfill portion 162. Alternatively, the wafer cover portion 164W and the underfill portion 162 may include the same material, for example, a filler, at a different ratio.

Figure 2D:
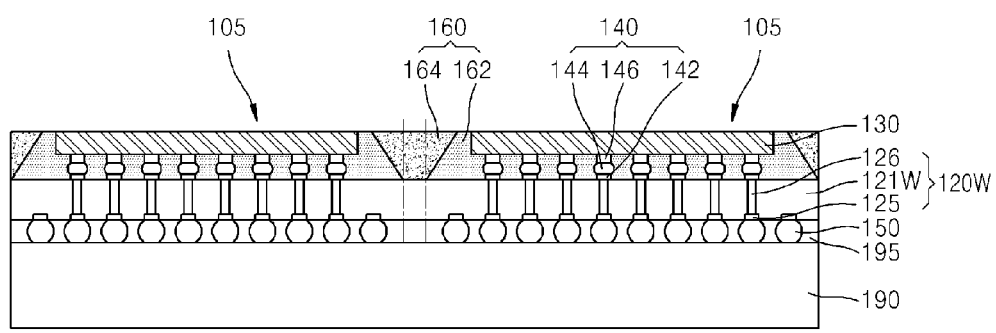

Referring to FIG. 2D, the top surface of the second chip 130 is exposed by grinding a top surface of the wafer cover portion 164W.

The chip stacking portions 105 each including the first chip 120, the second chip 130, and the internal sealant 160 are formed by performing a singulation process in a region indicated by one-dot solid line. The singulation process may be performed by blade sawing or laser sawing when the first chip 120 is attached onto the carrier substrate 190. Next, the chip stacking portions 105 may be detached from the carrier substrate 190. Thus, the chip stacking portions 105 may be finally manufactured.

Alternatively, when an electrical die sorting (EDS) test is carried out before the singulation process, the carrier substrate 190 may be first detached from the first chip 120 and an additional carrier substrate (not shown) may be attached onto the top surface of the second chip 130. In this case, the additional carrier substrate (not shown) may be detached from the second chip 130 after the EDS test is carried out and the singulation process is performed.

Figure 2E:
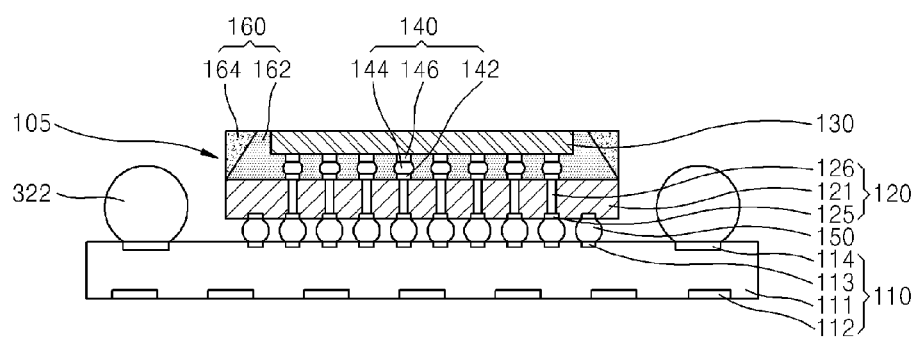

Referring to FIG. 2E, a process of attaching the chip stacking portions 105 onto the first substrate 110 may be performed. The chip stacking portions 105 may be mounted on the first substrate 110 by bonding the bumps 150 of the chip stacking portions 105 and the intermediate pads 113 of the first substrate 110.

In this process, the chip stacking portions 105 may be mounted on the first substrate 110 by using a process similar to a process of mounting one semiconductor chip on the first substrate 110 and related equipment. The chip stacking portions 105 may be formed previously as one device and has a hexahedral shape and thus may be easily handled when it is mounted on the first substrate 110.

Next, lower balls 322 may be disposed at an edge or side area of the first substrate 110. In the drawing, one lower ball 322 is disposed at both sides of the chip stacking portion 105, respectively. However, aspects of the inventive concept are not limited thereto, and a plurality of lower balls 322 may be disposed at both sides of the chip stacking portion 105, respectively.

Figure 2F:
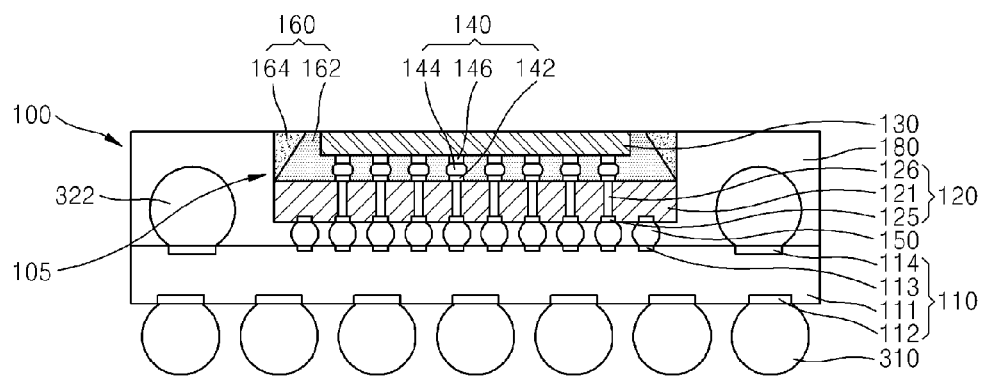

Referring to FIG. 2F, first, the first sealant 180 may be formed to surround the exposed bottom surface and side surface of the chip stacking portion 105. The first sealant 180 may be exposed so that, even after the first sealant 180 is formed on the top surface of the chip stacking portion 105, the top surface of the chip stacking portion 105 may be exposed by grinding. As a result, the first semiconductor package 100 of FIG. 1 is manufactured by performing the above described process.

Next, the bonding solder balls 310 may be formed on the bottom surface of the first substrate 110 to correspond to the lower pads 112. The bonding solder balls 310 may be formed by the above-described processes with reference to FIG. 2E or subsequent processes, for example, a final process of forming the semiconductor package 1000 (see FIG. 1).

Figure 2G:
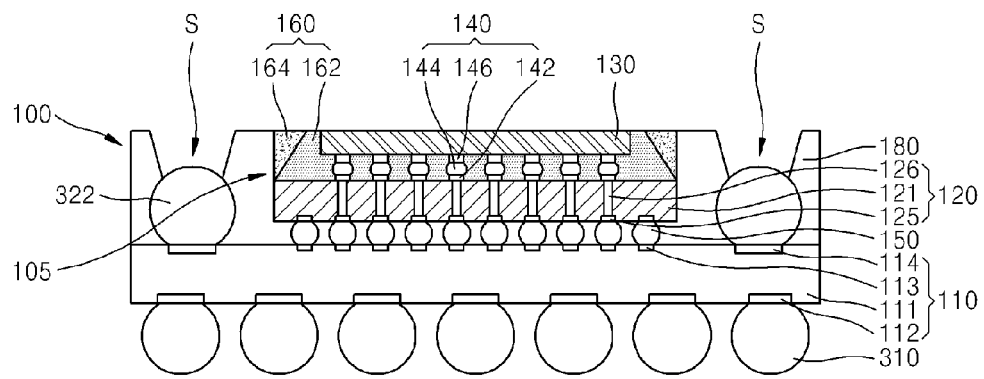

Referring to FIG. 2G, openings S through which at least a portion of each of the bonding solder balls 310 is exposed, are formed by removing a part of the first sealant 180. The openings S may be formed by removing the part of the first sealant 180 by using laser, for example. The openings S may extend to the bonding solder balls 310 while their lower portion is narrower. However, the shape of the openings S is not limited thereto.

Figure 2H:
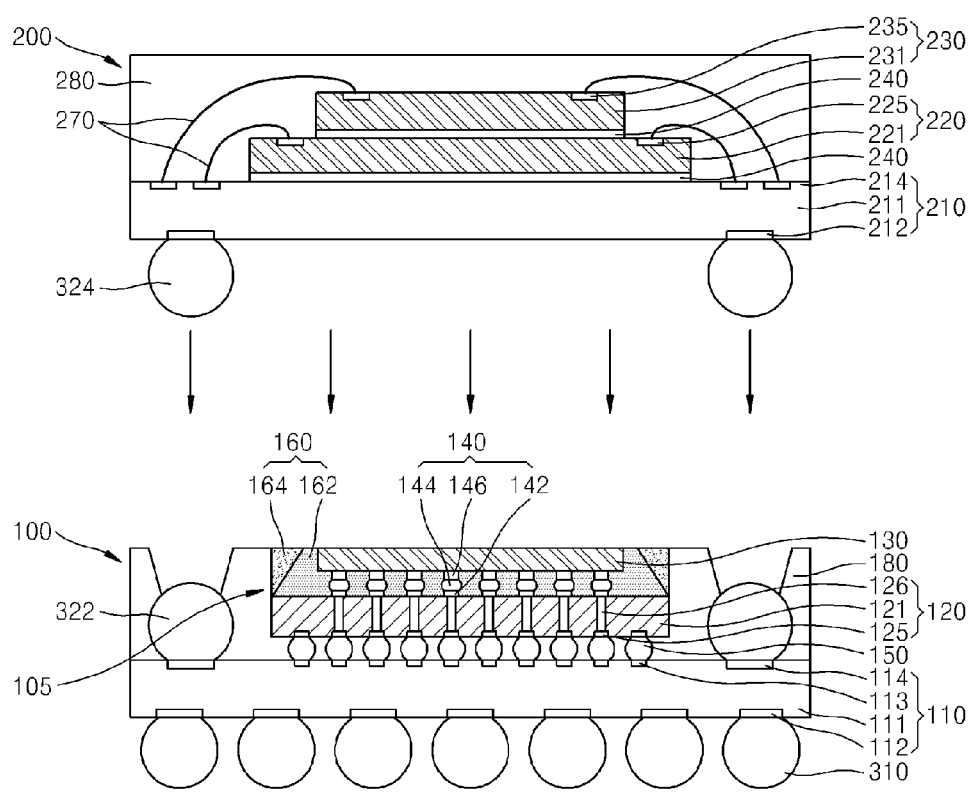

Referring to FIG. 2H, a second semiconductor package 200 is prepared. The second semiconductor package 200 may be manufactured by mounting a lower semiconductor chip 220 and an upper semiconductor chip 230 on the second substrate 210 by using an adhesive layer 240 and then forming the second sealant 280.

Next, a process of connecting the first semiconductor package 100 and the second semiconductor package 200 is performed. Upper balls 324 bonded to a lower portion of the second substrate 210 are bonded to lower balls 322 on the first substrate 110, respectively. The bonding process may be a thermal compression process and/or a reflow process. Thus, the first semiconductor package 100 and the second semiconductor package 200 may be physically and electrically connected to each other.

In the current process, the semiconductor package 1000 of FIG. 1 may be finally formed.

Figure 3A:
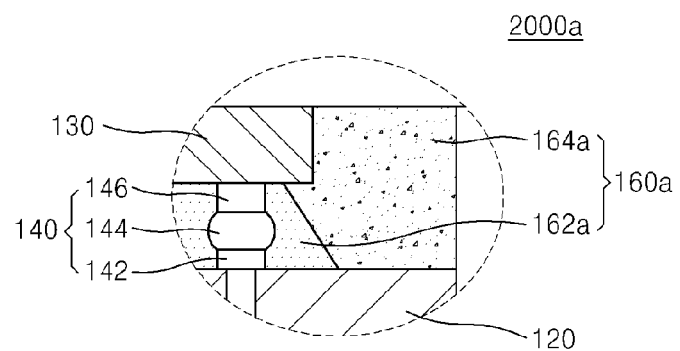
FIGS. 3A through 3C are partial cross-sectional views illustrating an internal sealant of a semiconductor package according to exemplary embodiments of the inventive concept.
Figure 3B:
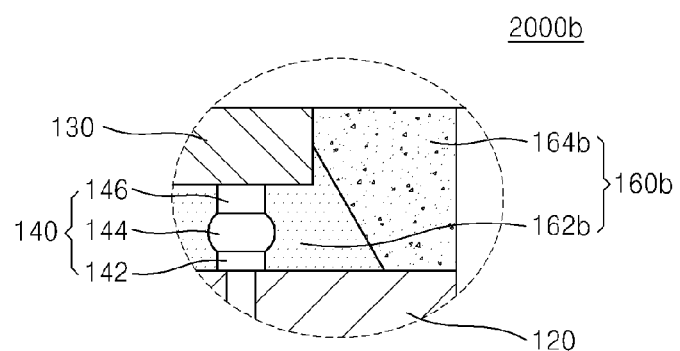
Figure 3C:
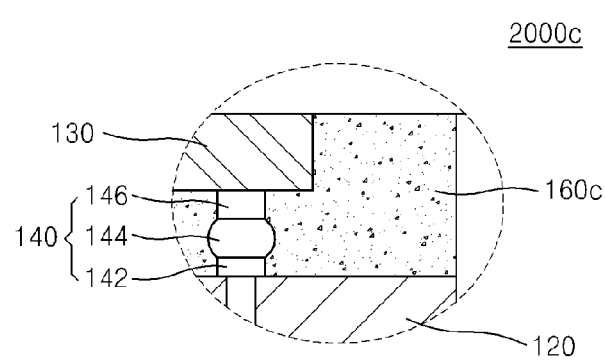

FIGS. 3A through 3C are partial cross-sectional views illustrating semiconductor packages 2000a, 2000b, and 2000c according to exemplary embodiments of the inventive concept. FIGS. 3A through 3C illustrate structures corresponding to the region P of FIG. 1.

Referring to FIG. 3A, an internal sealant 160a may include an underfill portion 162a for filling a space between the first chip 120 and the second chip 130, and a cover portion 164a disposed outside the underfill portion 162a. In the semiconductor package 2000a according to the present embodiment, the underfill portion 162a may not completely cover sides of the second chip 130, compared to the semiconductor package 1000 of FIG. 1. As illustrated in FIG. 3A, an upper boundary between the underfill portion 162a and the cover portion 164a may be formed on the bottom surface of the second chip 130.

Referring to FIG. 3B, an internal sealant 160b may include an underfill portion 162b for filling a space between the first chip 120 and the second chip 130, and a cover portion 164b disposed outside the underfill portion 162b. In the semiconductor package 2000b according to the present embodiment, the underfill portion 162b may not completely cover sides of the second chip 130, compared to the semiconductor package 1000 of FIG. 1. As illustrated in FIG. 3B, an upper boundary between the underfill portion 162b and the cover portion 164b may be formed on the lateral surface of the second chip 130.

Referring to FIG. 3C, the internal sealant 160c may be a single layer for filling a space between the first chip 120 and the second chip 130. The semiconductor package 2000c according to the present embodiment may be formed by unifying the processes of forming the underfill portion 162 and the wafer cover portion 164W described with reference to FIG. 2C, for example. For example, the semiconductor package 2000c may be formed not by forming the underfill portion 162 of FIG. 2C but by forming the internal sealant 160c. In this case, the internal sealant 160c may be formed by a molded underfill (MUF) process.

Figure 4:
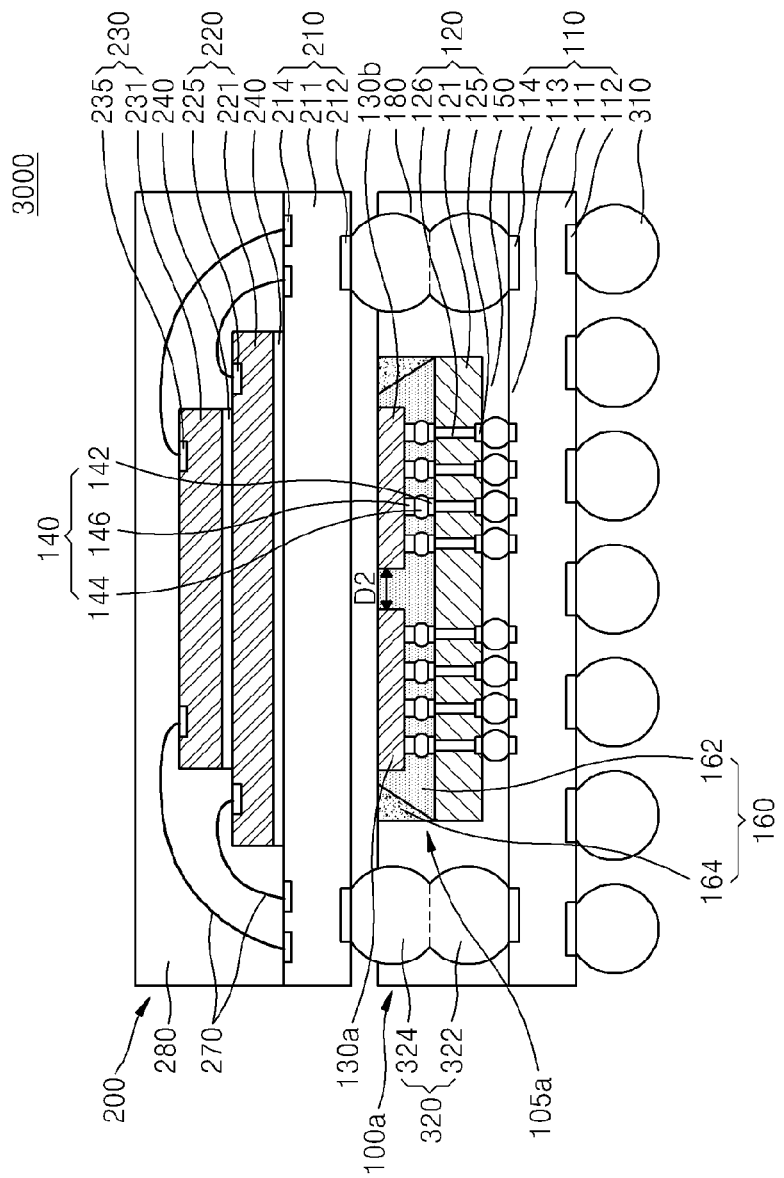
FIG. 4 is a cross-sectional view illustrating a semiconductor package according to an exemplary embodiment of the inventive concept.

FIG. 4 is a cross-sectional view illustrating a semiconductor package 3000 according to an exemplary embodiment of the inventive concept. Since the semiconductor package 3000 of FIG. 4 is similar to the semiconductor package 1000 of FIG. 1, like reference numerals of FIG. 1 refer to like elements of FIG. 4, and thus, repeated descriptions thereof are omitted.

Referring to FIG. 4, the semiconductor package 3000 according to the present embodiment includes a first semiconductor package 100a and a second semiconductor package 200.

The first semiconductor package 100a may include a first substrate 110, a chip stacking portion 105a, and a first sealant 180. The chip stacking portion 105a may include a first chip 120, two second chips 130a and 130b, connection members 140, and an internal sealant 160.

The second chips 130a and 130b may be spaced apart from each other on the first chip 120 by a predetermined distance D2. The second chips 130a and 130b may be electrically connected to the first chip 120 by means of the connection members 140. The number of the second chips 130a and 130b may be variously modified. In another embodiment, the number of the second chips 130a and 130b may be three or more.

An active layer may be formed on respective bottom surfaces of the first chip 120 and the second chips 130a and 130b. Thus, the first semiconductor package 100b may be of flip-chip type. The first chip 120 and the second chips 130a and 130b may include a plurality of semiconductor chips. For example, the first chip 120 may be a logic semiconductor chip, and the second chips 130a and 130b may be memory semiconductor chips.

The internal sealant 160 may include an underfill portion 162 for filling a space between the first chip 120 and the second chips 130a and 130b, and a cover portion 164 disposed outside the underfill portion 162. In another embodiment, the cover portion 164 may be partially formed in a region between the second chips 130a and 130b according to the size of the distance D2. According to the present embodiment, the chip stacking portion 105a may have a hexahedral shape due to the internal sealant 160, and the chip stacking portion 105a may be handled as one unit device when the semiconductor package 3000 is manufactured.

The semiconductor package 3000 according to the present embodiment may be formed by connecting the second chips 130a and 130b to the base wafer 120W in the above-described processes with reference to FIG. 2B.

In the present embodiment, the semiconductor package 3000 includes a plurality of semiconductor chips, such as the first chip 120, the second chips 130a and 130b, a lower semiconductor chip 220, and an upper semiconductor chip 230. Thus, the semiconductor package 3000 constitutes the chip stacking portion 105a of the SIP type including the TSVs 126 as a part of the POP and thus implementing a high-speed and high-density package.

Figure 5:
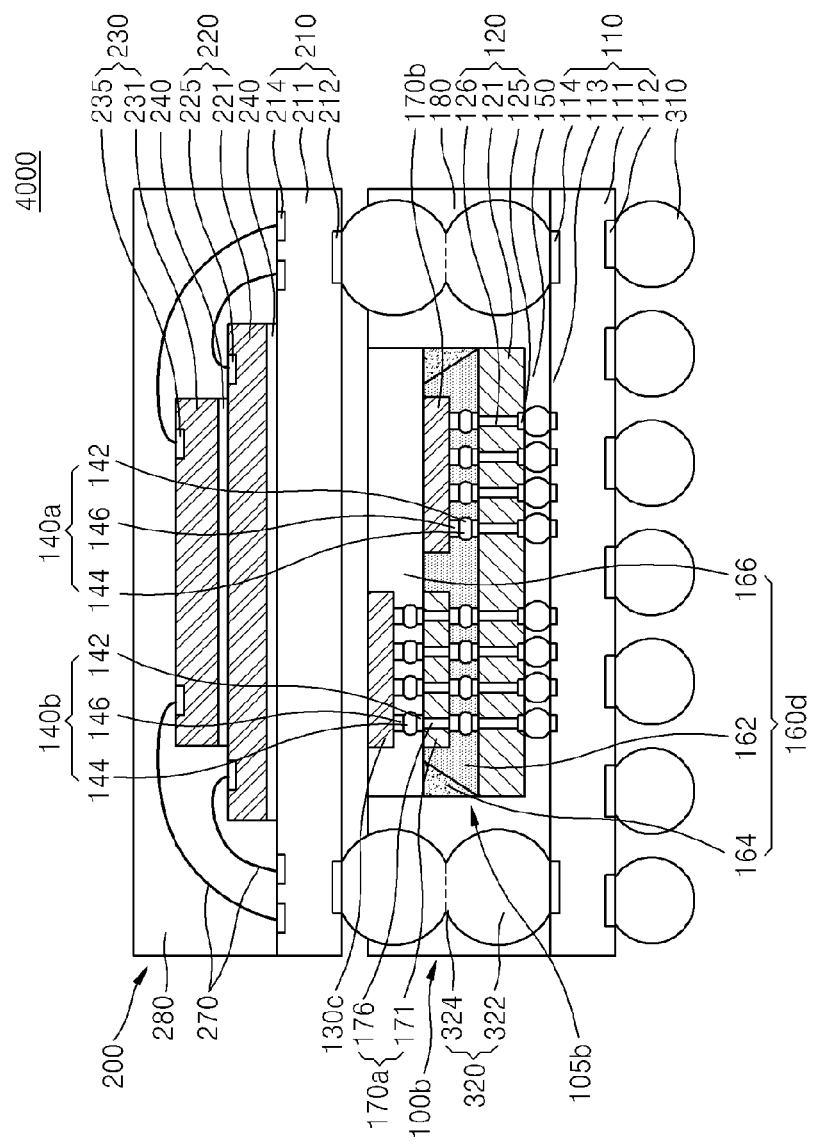
FIG. 5 is a cross-sectional view illustrating a semiconductor package according to an exemplary embodiment of the inventive concept.

FIG. 5 is a cross-sectional view illustrating a semiconductor package 4000 according to an exemplary embodiment of the inventive concept.

Since the semiconductor package 4000 of FIG. 5 is similar to the semiconductor package 1000 of FIG. 1, like elements of FIG. 1 represent like elements of FIG. 5, and thus repeated descriptions thereof are omitted.

Referring to FIG. 5, the semiconductor package 4000 according to the present embodiment includes a first semiconductor package 100b and a second semiconductor package 200. The first semiconductor package 100b may include a first substrate 110, a chip stacking portion 105b, and a first sealant 180.

The chip stacking portion 105b may include a first chip 120, a second chip 130c, third chips 170a and 170b, connection members 140a and 140b, and an internal sealant 160d.

The third chips 170a and 170b may be spaced apart from each other on the first chip 120 by a predetermined distance. The third chip 170a may include TSVs 176 and a body portion 171. The third chips 170a and 170b may be electrically connected to the first chip 120 by means of the connection members 140a. The connection members 140a may include pad portions 142, bonding portions 144, and pillar portions 146.

The second chip 130c may be disposed on the third chip 170a. The second chip 130c may be electrically connected to the third chip 170a by means of the connection members 140b. In another embodiment, one or more semiconductor chips may be further stacked between the second chip 130c and the third chip 170a. The connection members 140b may include pad portions 142, bonding portion 144, and pillar portions 146. The connection members 140a and 140b may include a conductive material, and for example, the conductive members 140a and 140b may include at least one selected from the group consisting of Cu, Al, Ag, Tin, Au, and solder.

An active layer may be formed on respective bottom surfaces of the first chip 120, the second chip 130c, and the third chips 170a and 170b. Thus, the first semiconductor package 100c may be of a flip-chip type. The first chip 120, the second chip 130c, and the third chips 170a and 170b each may include a plurality of semiconductor chips, and the plurality of semiconductor chips may be of the same or different types. For example, the first chip 120 may be a logic semiconductor chip, and the second chip 130c and the third chips 170a and 170b may be memory semiconductor chips.

The internal sealant 160d may include an underfill portion 162 for filling a space between the first chip 120 and the third chips 170a and 170b, a cover portion 164 disposed outside the underfill portion 162, and an upper cover portion 166 disposed at sides of the second chip 130c. The internal sealant 160d may be formed of an underfill resin, such as an epoxy resin, silica filler, or flux. The underfill portion 162, the cover portion 164, and the upper cover portion 166 may include different materials. Alternatively, the cover portion 164 and the upper cover portion 166 may be formed of the same material. In the present embodiment, the chip stacking portion 105b has a hexahedral shape due to the internal sealant 160d and may be handled as one unit structure when the semiconductor package 4000 is manufactured.

The first sealant 180 may surround the chip stacking portion 105b on the first substrate 110 to protect the chip stacking portion 105b. The first sealant 180 may be spaced apart from the second substrate by a predetermined distance so that a top surface of the chip stacking portion 105b may be exposed. The second chip 130c and the internal sealant 160d, in particular, the upper cover portion 166 may be exposed to a top surface of the first semiconductor package 100b. The first sealant 180 may be formed so that the top surface of the chip stacking portion 105b may be exposed and thus the overall height of the first semiconductor package 100b may be reduced. As a result, the overall height of the semiconductor package 4000 may be reduced.

The semiconductor package 4000 according to the present embodiment may be formed by performing the grinding process described above with reference to FIG. 2D and then additionally performing a process of stacking the second chip 130c. In addition, the semiconductor package 4000 of FIG. 5 may be formed by additionally performing a process of forming the upper cover portion 166 that covers sides and top surface of the second chip 130c and a process of exposing the top surface of the second chip 130c by a grinding process.

In the present embodiment, the semiconductor package 4000 includes a plurality of semiconductor chips, such as the first chip 120, the second chip 130c, the third chips 170a and 170b, the lower semiconductor chip 220, and the upper semiconductor chip 230. Thus, the semiconductor package 4000 constitutes the chip stacking portion 105b of the SIP type including the TSVs 126 as a part of the PIP and thus implementing a high-speed and high-density SIP.

Figure 6:
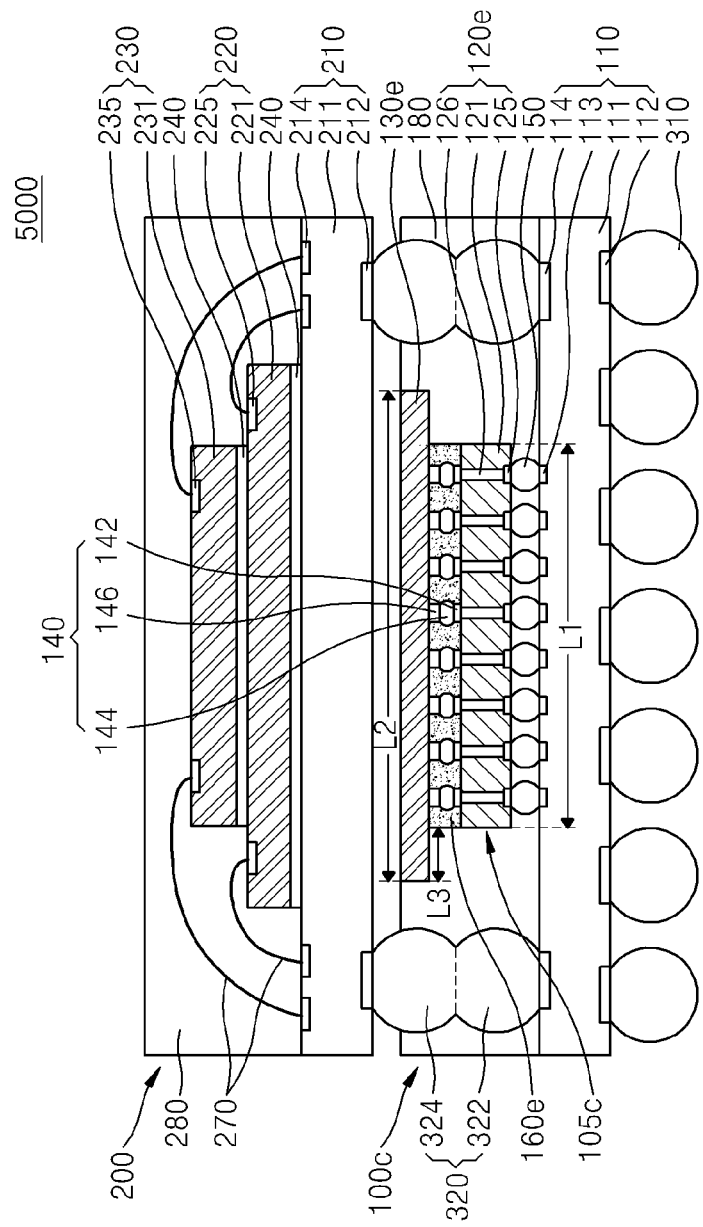
FIG. 6 is a cross-sectional view illustrating a semiconductor package according to an exemplary embodiment of the inventive concept.

FIG. 6 is a cross-sectional view illustrating a semiconductor package 5000 according to an exemplary embodiment of the inventive concept. The semiconductor package 5000 of FIG. 6 is similar to the semiconductor package 1000 of FIG. 1, like reference numerals of FIG. 1 represent like elements of FIG. 6, and thus repeated descriptions thereof are omitted.

Referring to FIG. 6, the semiconductor package 5000 according to the present embodiment includes a first semiconductor package 100c and a second semiconductor package 200. The first semiconductor package 100c may include a first substrate 110, a chip stacking portion 105c, and a first sealant 180.

The chip stacking portion 105c may include a first chip 120e, a second chip 130e, connection members 140, and an internal sealant 160e.

The first chip 120e includes a body portion 121, chip pads 125 disposed inside the first chip 120e, and TSVs 126 formed in the first chip 120e. The second chip 130e may be electrically connected to the first chip 120e by means of the connection members 140.

One cross-section of the first chip 120e may have a first length L1, and one cross-section of the second chip 130e may have a second length L2 that is greater than the first length L1. Thus, the chip stacking portion 105c of the semiconductor package 5000 according to the present embodiment may have a length of at least one cross-section of the second chip 130e disposed at an upper portion than the first chip 120 that is greater than a length of one cross-section of the first chip 120e disposed at a lower portion than the second chip 130e in the same direction.

An active layer may be formed on respective bottom surfaces of the first chip 120e and the second chip 130e. Thus, the first semiconductor package 100c may be of flip-chip type. The first chip 120e and the second chip 130e may include a plurality of semiconductor chips, and the plurality of semiconductor chips may be of the same or different types. For example, the first chip 120e may be a logic semiconductor chip, and the second chip 130e may be a memory semiconductor chip.

The internal sealant 160e may fill a space between the first chip 120e and the second chip 130e on the first chip 120e. Both sides of the internal sealant 160e may extend from the side of the first chip 120e in a vertical direction and may contact the second chip 130e. In this regard, both sides of the second chip 130e may protrude from the internal sealant 160e to a predetermined length L3. In a modified embodiment, both sides of the internal sealant 160e may extend from the side of the first chip 120e at a predetermined angle and may contact the second chip 130e. In this regard, both sides of the second chip 130e may protrude from the internal sealant 160e to a length smaller than the length L3. Thus, according to embodiments, the length L3 may be equal to or greater than 0 and may be equal to or less than a value L2−L1. The internal sealant 160e may be formed of an underfill resin, such as an epoxy resin, silica filler, or flux.

The internal sealant 160e of FIG. 6 may have a length to correspond to a length of the first chip 120e, compared to the internal sealant 160 of FIG. 1 having a length longer than the second chip 130. Thus, the internal sealant 16 and 16e may be determined according to a length of one of the first chip 120, 120e and the second chip 130, 130e or an overlap area between the first chip 120, 120e and the second chip 130, 130e with respect to the first substrate 110.

The first sealant 180 may surround the chip stacking portion 105c on the first substrate 110 to protect the chip stacking portion 105c. The first sealant 180 may be spaced apart from the second substrate 210 by a predetermined distance so that the top surface of the chip stacking portion 105c may be exposed. The second chip 130e may be exposed to the top surface of the first semiconductor package 100c.

The semiconductor package 5000 according to the present embodiment may be formed by unifying the processes of forming the underfill portion 162 and the wafer cover portion 164W described with reference to FIG. 2C. For example, the semiconductor package 5000 may be formed not by forming the underfill portion 162 but by forming the internal sealant 160e in a space between the first chip 120e and the second chip 130e.

Figure 7:
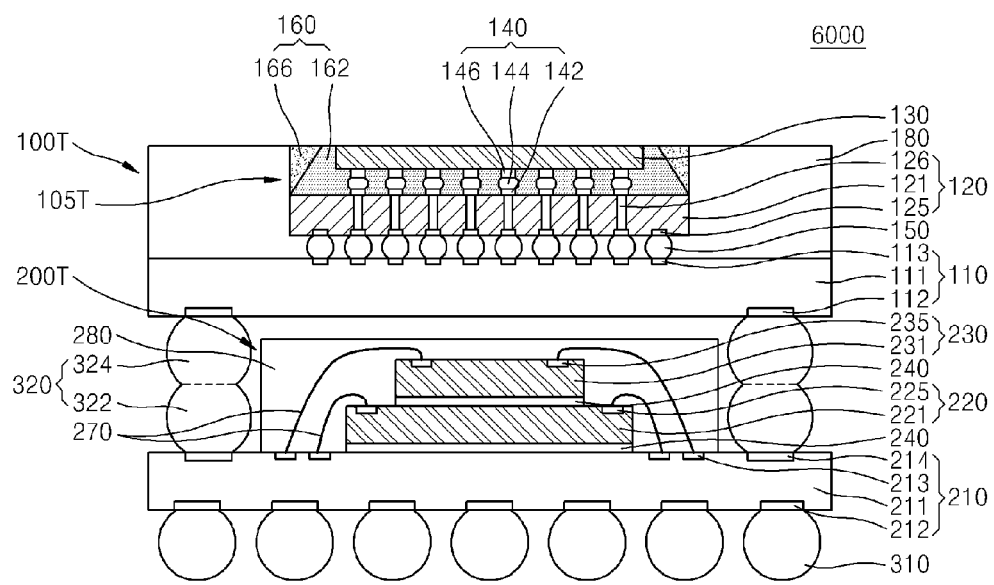
FIG. 7 is a cross-sectional view illustrating a semiconductor package according to an exemplary embodiment of the inventive concept.

FIG. 7 is a cross-sectional view illustrating a semiconductor package 6000 according to an exemplary embodiment of the inventive concept.

Since the semiconductor package 6000 of FIG. 7 is similar to the semiconductor package 1000 of FIG. 1, like reference numerals of FIG. 1 represent like elements of FIG. 7, and thus repeated descriptions thereof are omitted.

Referring to FIG. 7, the semiconductor package 6000 according to the present embodiment includes a first semiconductor package 100T and a second semiconductor package 200T. The semiconductor package 6000 according to the present embodiment may be a POP type semiconductor package on which the first semiconductor package 100T is stacked on the second semiconductor package 200T, compared to the semiconductor package 1000 of FIG. 1. In the present embodiment of FIG. 7, both the first semiconductor package 100T and the second semiconductor package 200T may include chip stacking portion 105T.

The upper or first semiconductor package 100T may include a first substrate 110, chip stacking portions 105T, and a first sealant 180. The chip stacking portions 105T each may include a first chip 120, a second chip 130, connection members 140, and an internal sealant 160.

The lower or second semiconductor package 200T may include a second substrate 210, a lower semiconductor chip 220, an upper semiconductor chip 230, and a second sealant 280. The second substrate 210 may support the lower semiconductor chip 220 and the upper semiconductor chip 230 and may include a body portion 211, lower pads 212 disposed on a bottom surface of the second substrate 210, intermediate pads 213 disposed on a top surface of the second substrate 210, and upper pads 214 disposed on the top surface of the second substrate 210.

The first semiconductor package 100T and the second semiconductor package 200T may be electrically connected to each other by means of package-connecting solder balls 320. In addition, bonding solder balls 310 may be attached onto the bottom surface of the second substrate 210.

In the present embodiment, the semiconductor package 6000 includes a plurality of semiconductor chips, such as the first chip 120, the second chip 130, the lower semiconductor chip 220, and the upper semiconductor chip 230. The plurality of semiconductor chips may have a plurality of functions. The semiconductor package 6000 constitutes a portion of the POP as the chip stacking portions 105T including the TSVs 126 and thus implementing a high-speed high-density package.

Figure 8:
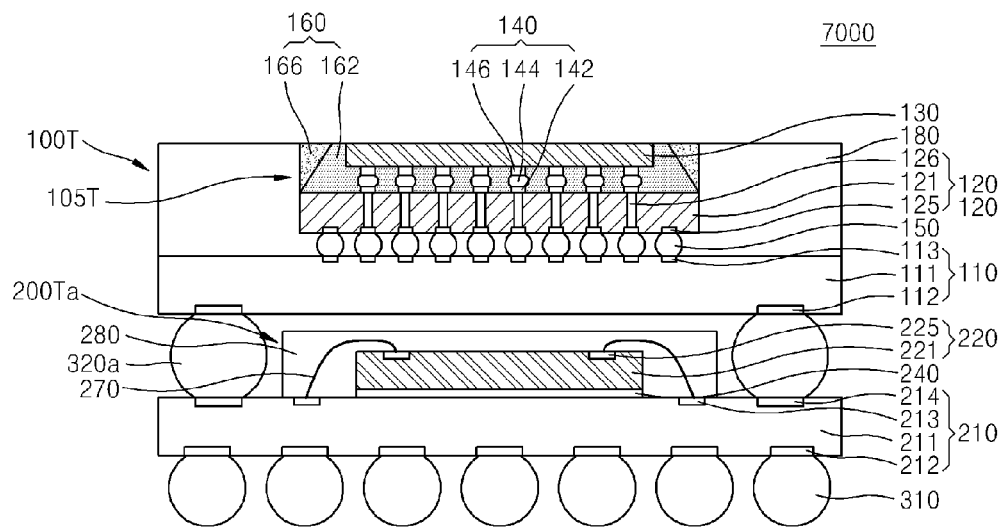
FIG. 8 is a cross-sectional view illustrating a semiconductor package according to an exemplary embodiment of the inventive concept.

FIG. 8 is a cross-sectional view illustrating a semiconductor package 7000 according to an exemplary embodiment of the inventive concept.

Since the semiconductor 7000 package of FIG. 8 is similar to the semiconductor package 1000 of FIG. 1, like reference numerals of FIG. 1 represent like elements of FIG. 8, and thus repeated descriptions thereof are omitted.

Referring to FIG. 8, the semiconductor package 7000 according to the present embodiment includes a first semiconductor package 100T and a second semiconductor package 200Ta. The semiconductor package 7000 according to the present embodiment may be a POP type semiconductor package on which the first semiconductor package 100T is stacked on the second semiconductor package 200Ta, unlike in the semiconductor package of FIG. 1. In addition, the lower, second semiconductor package 200Ta of the semiconductor package 7000 of FIG. 8 may include only one semiconductor chip 220a, unlike in the semiconductor package 6000 of FIG. 7.

The lower, second semiconductor package 200Ta may include a second substrate 210, a semiconductor chip 220, and a second sealant 280. The second substrate 210 may support the semiconductor chip 220 and may include a body portion 211, lower pads 212 disposed on a bottom surface of the second substrate 210, intermediate pads 213 disposed on a top surface of the second substrate 210, and upper pads 214 disposed on the top surface of the second substrate 210. The semiconductor chip 220 may include a body portion 221 and may be installed at the second substrate 210 by means of an adhesive layer 240. The second sealant 280 surrounds the semiconductor chip 220 and wires 270 to protect them.

The first semiconductor package 100T and the second semiconductor package 200Ta may be electrically connected to each other by means of package-connecting solder balls 320a. The package-connecting solder balls 320a may be interposed between the lower pads 112 of the first substrate 110 and the upper pads 214 of the second substrate 210 so that the lower pads 112 of the first substrate 110 and the upper pads 214 of the second substrate 210 may be electrically connected to each other. In addition, the package-connecting solder balls 320a may structurally securely fix the first semiconductor package 100T and the second semiconductor package 200Ta.

Bonding solder balls 310 may be attached onto the bottom surface of the second substrate 210. The bonding solder balls 310 may be formed of the same material used in forming the package-connecting solder balls 320a. The first semiconductor package 100T and the second semiconductor package 200Ta may be electrically connected to an external device, for example, a system board or a main board, by means of the bonding solder balls 310.

In the present embodiment, the semiconductor package 7000 includes a plurality of semiconductor chips, such as the first chip 120, the second chip 130, and the semiconductor chip 220. The plurality of semiconductor chips may have a plurality of functions. Thus, the semiconductor package 7000 constitutes a portion of the POP as the chip stacking portions 105T including TSVs 126 and thus implementing a high-speed high-density package.

Figure 9:
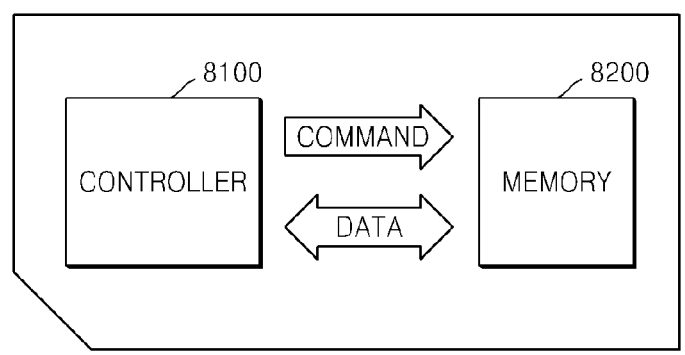
FIG. 9 is a block diagram illustrating a memory card including a semiconductor package according to an exemplary embodiment of the inventive concept.

FIG. 9 illustrates an electronic device, for example, a memory card 8000 including a semiconductor package, according to an exemplary embodiment of the inventive concept.

Referring to FIG. 9, the memory card 8000 includes a controller 8100 and a memory 8200. The controller 8100 and the memory 8200 may be disposed to exchange electrical signals with each other. For example, if a command is given by the controller 8100, the memory 8200 may transmit data. The controller 8100 and/or the memory 8200 may include a semiconductor package according to one of the embodiments of the inventive concept. The semiconductor package may be the semiconductor package illustrated in FIGS. 1 through 8. The memory 8200 may include a memory array (not illustrated) or a memory array bank (not illustrated).

The memory card 8000 may be used in a memory device using various cards, such as memory stick cards, smart media cards (SMs), secure digital cards (SDs), mini secure digital cards (mini SDs), or multimedia cards (MMCs). The memory card 8000 may also have terminals (not illustrated) connected to the controller 8100 to be detachably attached to terminals of an electronic apparatus to exchange data (information) to be stored in the memory 8200.

Figure 10:
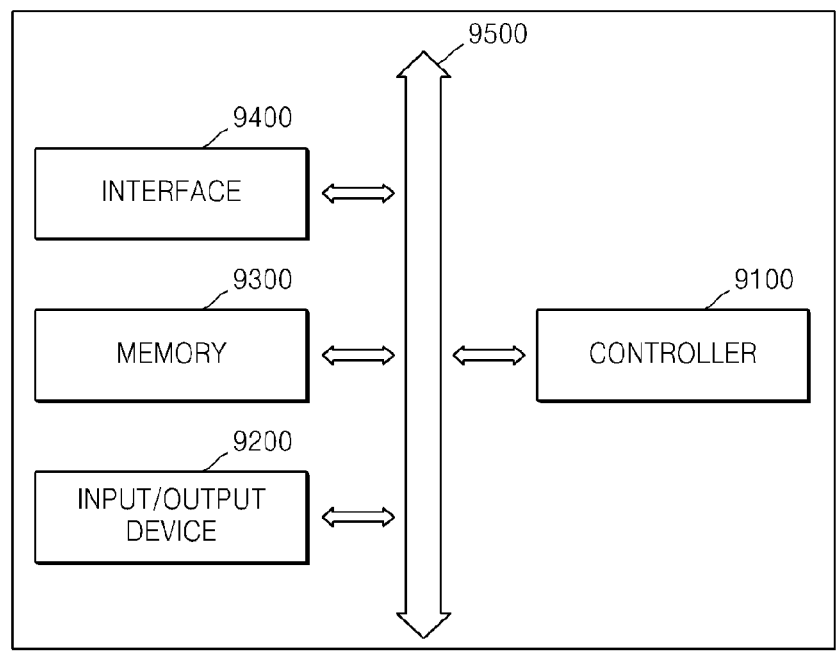
FIG. 10 is a block diagram illustrating an electronic system including a semiconductor package according to an exemplary embodiment of the inventive concept.

FIG. 10 is a block diagram illustrating an electronic system 9000 including a semiconductor package according to an exemplary embodiment of the inventive concept.

Referring to FIG. 10, the electronic system 9000 may include a controller 9100, an input/output device 9200, a memory 9300, and an interface 9400. The electronic system 9000 may be a mobile system or a system to transmit or receive information. The mobile system may be a personal digital assistant (PDA), a portable computer, a web tablet, a wireless phone, a mobile phone, a digital music player, a tablet computer apparatus, or a memory card.

The controller 9100 may control an execution program in the electronic system 9000. The controller 9100 may include a microprocessor, a digital signal processor, a microcontroller, or the like. The input/output device 9200 may be used in inputting or outputting data from or to the electronic system 9000.

In addition, the electronic system 9000 may be connected to an external device, for example, a personal computer (PC) or a network, by using the input/output device 9200 and may exchange data with the external device. The input/output device 9200 may be a keypad, a keyboard, or a display, for example. The input/output device 9200 may be a touch panel to display a user interface to display an image and to receive a user input, data, or command. The memory 9300 may store a code and/or data for an operation of the controller 9100 or may store data processed by the controller 9100. The controller 9100 and the memory 9300 may include a semiconductor package according to one of the embodiments of the inventive concept. The semiconductor package may be the semiconductor package illustrated in FIGS. 1 through 8. In addition, the interface 9400 may be a data transmission path between the electronic system 900 and another external device (not illustrated) through a wired or wireless communication. The controller 9100, the input/output device 9200, the memory 9300, and the interface 9400 may communicate with each other via a bus 9500. The electronic system 9000 may have a For example, the electronic system 9000 may be used in a mobile phone, a tablet computer apparatus, a mobile computer apparatus, an MP3 player, a navigation device, a portable multimedia player (PMP), a solid state disk (SSD), or household appliances.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor package comprising:
   a first semiconductor package comprising a first substrate, a chip stacking portion disposed on the first substrate and comprising a plurality of first semiconductor chips, and a first sealant surrounding the chip stacking portion on the first substrate;

a second semiconductor package comprising a second substrate, at least one second semiconductor chip disposed on the second substrate, and a second sealant surrounding the second semiconductor chip on the second substrate; and a package-connecting member to electrically connect the first semiconductor package and the second semiconductor package, wherein the plurality of first semiconductor chips comprise a first chip having through silicon vias (TSVs), and a second chip electrically connected to the first chip via the TSVs, and the chip stacking portion comprises an internal sealant filling a space between the first chip and the second chip and extending to sides of the second chip.

2. The semiconductor package of claim 1, wherein the second chip, the first sealant, and the internal sealant are exposed through a top surface of the first semiconductor package.

3. The semiconductor package of claim 1, wherein:
the internal sealant comprises an underfill portion filling a space between the plurality of first semiconductor chips, and a cover portion disposed outside the underfill portion; and
the internal sealant does not cover a top surface of the first semiconductor chip disposed at the uppermost portion of the chip stacking portion.

4. The semiconductor package of claim 1, wherein the semiconductor package comprises a package on package (POP) type on which the second semiconductor package is stacked on the first semiconductor package.

5. The semiconductor package of claim 4, wherein a top surface of the first sealant is spaced apart from a bottom surface of the second substrate by a predetermined distance.

6. The semiconductor package of claim 1, wherein:
the chip stacking portion as a flip-chip type is mounted on the first substrate; and
the chip stacking portion and the first substrate are electrically connected to each other by bumps.

7. The semiconductor package of claim 1, wherein the package-connecting member is disposed at at least one side portion of the chip stacking portion to connect the first substrate and the second substrate.

8. The semiconductor package of claim 1, further comprising:
connection members disposed between the first chip and the second chip and electrically connected to the TSVs.

9. The semiconductor package of claim 1, wherein:
the second semiconductor package comprises a plurality of second semiconductor chips; and
the at least one second semiconductor chip comprises second TSVs.

10. The semiconductor package of claim 1, wherein the second chip comprises two or more second sub-chips spaced apart from each other on the first chip by a predetermined distance.

11. The semiconductor package of claim 1, wherein at least one first semiconductor chip comprises another TSVs and is disposed between the first chip and the second chip.

12. The semiconductor package of claim 1, wherein the first chip has an area smaller than an area of the second chip.

13. The semiconductor package of claim 1, wherein the first chip comprises a length of at least one cross-section that is less than a length of one cross-section of the second chip.

14. The semiconductor package of claim 13, wherein the first sealant and the second chip are exposed through the top surface of the first semiconductor package.

15. A semiconductor package comprising:
a first semiconductor package; and
a second semiconductor package disposed on the first semiconductor package and electrically connected to the first semiconductor package,
wherein at least one of the first semiconductor package and the second semiconductor package comprises a chip stacking portion, and
the chip stacking portion comprises a plurality of semiconductor chips electrically connected each other via through silicon vias (TSVs) and an internal sealant surrounding the plurality of semiconductor chips.

16. A semiconductor package comprising:
a first semiconductor package having a first substrate and two or more first semiconductor chips disposed on a first portion of the first substrate and electrically connected to each other using one or more through silicon vias;
a second semiconductor package having a second substrate and one or more second semiconductor chips disposed on the second substrate; and
one or more package-connecting balls disposed on a second portion of the first substrate, to electrically connect the first semiconductor package and the second semiconductor package, and to protrude from the first semiconductor package by a height to maintain a distance between the first semiconductor package and the second semiconductor package,
wherein a top surface of the uppermost first semiconductor chip is exposed through a top surface of the first semiconductor package.

17. The semiconductor package of claim 16, wherein the through silicon vias are formed in at least one of the first semiconductor chips to electrically connect the other one of the first semiconductor chips to the substrate.

18. The semiconductor package of claim 16, wherein the two or more first semiconductor chips of the first semiconductor package comprises:
a first chip having the through silicon vias and disposed on the first substrate; and
a second chip disposed on the second chip to be electrically connected to the substrate through the through silicon vias.

19. The semiconductor package of claim 16, wherein:
the first semiconductor package comprises a chip stacking portion disposed on the first portion of the first substrate;
the first semiconductor chips comprises a first chip and a second chip; and
the chip stacking portion comprises the first chip having the through silicon vias and disposed on the first portion of the first substrate, the second chip spaced apart from the first chip by a distance and electrically connected to the first substrate through the through silicon vias of the first chip, and an internal sealant formed between the first chip and the second chip.

20. The semiconductor package of claim 19, wherein the first semiconductor package comprises a first sealant formed between the chip stacking portion and the first substrate and between the chip stacking portion and the one or more package-connecting balls.

* * * * *